United States Patent [19]
Imanishi

[11] Patent Number: 5,610,410
[45] Date of Patent: Mar. 11, 1997

[54] III-V COMPOUND SEMICONDUCTOR DEVICE WITH SCHOTTKY ELECTRODE OF INCREASED BARRIER HEIGHT

[75] Inventor: Kenji Imanishi, Kawasaki, Japan

[73] Assignee: Fujitsu Limited, Kawasaki, Japan

[21] Appl. No.: 398,519

[22] Filed: Mar. 3, 1995

[30] Foreign Application Priority Data

Mar. 18, 1994 [JP] Japan ................................. 6-048875

[51] Int. Cl.$^6$ ............................................. H01L 31/0256
[52] U.S. Cl. ........................... 257/76; 257/192; 257/194; 257/280; 257/472; 257/615
[58] Field of Search ................................. 257/192, 194, 257/76, 280, 472, 615

[56] References Cited

U.S. PATENT DOCUMENTS 4,814,838  3/1989  Kuroda et al. ........................... 257/194

Primary Examiner—Edward Wojciechowicz
Attorney, Agent, or Firm—Staas & Halsey

[57] ABSTRACT

A field effect group III–V compound semiconductor device having a Schottky gate electrode includes: a semiconductor substrate; a plurality of group III–V compound semiconductor crystal layers including an active layer for transferring carriers and formed on the semiconductor substrate; an InAlP layer formed at least a partial surface of the group III–V compound semiconductor crystal layers; a gate electrode formed on the InAlP layer and forming Schottky contact therewith; and a pair of source/drain electrodes disposed to interpose therebetween the gate electrode, and forming ohmic contact with the active layer. A group III-V compound semiconductor device is provided with a Schottky electrode highly resistant to a current flow.

18 Claims, 6 Drawing Sheets 5,610,410

III-V COMPOUND SEMICONDUCTOR DEVICE WITH SCHOTTKY ELECTRODE OF INCREASED BARRIER HEIGHT

BACKGROUND OF THE INVENTION

1. Field of the Invention

The present invention relates to a field effect semiconductor device, and more particularly to a field effect group III-V compound semiconductor device with a Schottky gate electrode.

2. Description of the Related Art

A group III-V compound semiconductor has a carrier mobility higher than Si or Ge semiconductor. Two dimensional electron gas having a very high mobility can be obtained by using a narrow potential valley at a hereto junction and a group III-V compound semiconductor crystal having a low impurity concentration.

For example, a high electron mobility transistor (HEMT) is known as a Field effect semiconductor device using such a two dimensional electron gas. A high speed compound semiconductor device such as HEMT can be used for high speed computers or other devices.

HEMT has been realized initially by using an AlGaAs/GaAs hereto junction. It has been found thereafter that AlGaAs contains DX centers of a deep level trap which can cause a distortion in an I-V characteristic curve. Another type of HEMT has been developed which incorporates an InGaP/GaAs hereto junction not containing DX centers. For a channel (electron transfer or electron travelling) layer, InGaAs is also used as a substitute for GaAs.

A good insulating film such as a silicon oxide film on a Si crystal has not been found as yet for a group III-V compound semiconductor crystal. Therefore, an insulating gate electrode such as a MOS type control electrode of an Si semiconductor device cannot be used For group III-V compound semiconductor crystal, but a Schottky electrode can be used for its gate electrode. A Schottky contact is Formed by a metal/semiconductor contact so that a forward current can flow if a forward bias equal to a Schottky voltage or higher is applied.

FIG. 6 shows an example of the structure of a HEMT manufactured by conventional techniques. On the surface of a semi-insulating GaAs substrate 21 doped with Cr or another element, a non-doped GaAs buffer layer 22 is epitaxially grown, and thereafter a non-doped GaAs active layer 23 is epitaxially grown on the buffer layer 22. On the active layer 23, a non-doped AlGaAs spacer layer 24, an Si-doped n-type AlGaAs electron supply layer 25, and an Si-doped n-type GaAs contact layer 27 are epitaxially grown in this order. The contact layer 27 is partially removed to form thereon a Schottky gate electrode 29 made of Al, $Wsi_x$, TiW or another clement. On the contact layer 27, source/drain electrodes 28 are formed and ohmic contacts are formed by alloying AuGe/Au, Ni/AuGe/Au and so on.

AlGaAs contains DX centers which adversely affect the characteristics of a HEMT. The electron supply layer 25 may be made of InGaP instead of AlGaAs. In this case, the Schottky gate 29 is formed on an n-type InGaP layer.

A MESFET does not use an electron supply layer, and a Schottky gate electrode and a pair of source/drain electrodes on both sides of the gate electrode are formed on an n-type channel layer. A GaAs MESFET has a Schottky gate electrode of Al, $WSi_x$, or another element Formed on an n-type GaAs layer.

The gate electrode of such a field effect group III-V compound semiconductor device controls the transfer of carriers in the channel layer. A Schottky gate electrode has a Schottky barrier specific to an underlying semiconductor layer. If a forward bias voltage equal to or higher than a Schottky voltage is applied, a forward current will flow through the gate. If the amplitude of an input signal voltage is large and a large forward voltage is applied to the gate electrode, a forward current flows through the gate.

As described above, a conventional Schottky gate electrode of a group III-V compound semiconductor device has a limited value of a Schottky barrier height and a current flows through the gate if a high forward voltage is applied thereto.

SUMMARY OF THE INVENTION

It is an object of the present invention to provide a group III-V compound semiconductor device with a Schottky electrode highly resistant to a current flow.

It is another object of the present invention to provide a field effect compound semiconductor device with a gate electrode highly resistant to a gate current flow.

According to one aspect of the present invention, there is provided a field effect compound semiconductor device including: a semiconductor substrate; a plurality of group III-V compound semiconductor crystal layers formed on the semiconductor substrate, and including an active layer for transferring carriers; an InAlP layer formed at least on a partial surface of the group III-V compound semiconductor crystal layers; a gate electrode formed on the InAlP layer, forming Schottky contact; and a pair of source/drain electrodes disposed to interpose therebetween the gate electrode, and forming ohmic contact with the active layer.

According to another aspect of the present invention, there is provided a field effect compound semiconductor device including: a group III-V compound semiconductor crystal layer for transferring carriers in the surface region of the layer; an InAlP crystal layer formed at least on a partial surface of the group III-V compound semiconductor crystal layer; a gate electrode formed on the InAlP crystal layer, forming a Schottky contact; and a pair of source/drain electrodes interposing therebetween the gate electrode, and forming ohmic contact with the group III-V compound semiconductor crystal layer.

The InAlP layer is inserted between the gate electrode and the group III-V compound semiconductor crystal layer so that the Schottky contact of the gate electrode is formed between the gate electrode and the InAlP layer. Use of the InAlP layer as the underlying layer of the gate electrode forms a high Schottky barrier which has been conventionally unable to form. With a high Schottky barrier, a high forward voltage can be applied to the gate without flowing current therethrough.

DETAILED DESCRIPTION OF THE PREFERRED EMBODIMENTS

It is desired to raise a Schottky barrier height of a gate electrode in order to reduce a gate leak current. The inventor conducted the following preliminary experiments in order to find a high Schottky barrier height gate electrode.

Figure 7:
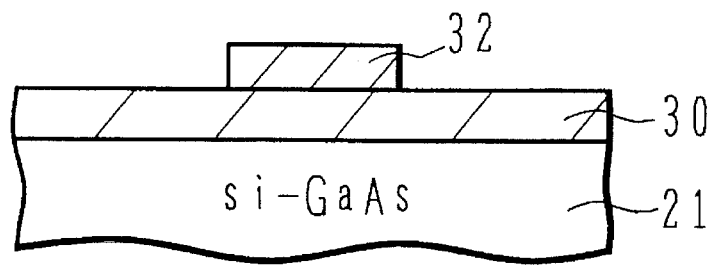
FIG. 7 is a schematic cross sectional view showing the structure off a sample used in preliminary experiments of the invention.

As shown in FIG. 7, on a semi-insulating GaAs substrate 21, an n-type group III-V compound semiconductor layer 30 was grown to a thickness of about 150 nm by metal organic chemical vapor deposition (MOCVD). On this layer 30 an Al electrode 32 having a diameter of about 100 μm was formed by evaporation. In forming the Al electrode 32, a resist mask having an opening conformal to the electrode shape was preliminarily formed on the semiconductor layer 30, an Al electrode layer was deposited by evaporation, and unnecessary Al electrode layer was removed by lift-off.

A variety of group III-V compound semiconductor layers (including mixed crystal) was used for the compound semiconductor layer 30.

A Schottky barrier at a Schottky contact was measured by using n-type GaAs, n-type AlGaAs (group III composition for this experiment: Al 0.3, Ga 0.7), n-type InGaP (composition nearly lattice matched to GaAs: In 0.5, Ga 0.5), and n-type InAlP (composition nearly lattice matched to GaAs: In 0.5, Al 0.5), as the group III-V compound semiconductor layer 30. The Schottky barrier height was measured from the forward current-voltage (I-V) characteristics. The n-type group III-V compound semiconductor layer was doped with Si to have an impurity concentration of about $1.5\times10^{18}$ cm$^{-3}$. The impurity concentration was measured by a capacitance-voltage (C-V) method. The measurement results are shown in Table 1.

TABLE 1

| Semiconductor Group III–V Compound | Schottky Barrier Height |
|---|---|
| n-GaAs | 0.55 V |
| n-InGaP | 0.69 V |
| n-AlGaAs | 0.68 V |
| n-InAlP | 0.76 V |

Current flowing through a Schottky electrode is known to reduce exponentially as a Schottky barrier becomes high. Therefore, a leak current of a Schottky gate electrode depends exponentially on a negative value of a Schottky barrier height off a Schottky gate electrode.

An underlying semiconductor layer of a Schottky gate electrode in the conventional field effect semiconductor device is formed of n-type GaAs, n-type InGaP, n-type AlGaAs, or other compound semiconductors. According to the experiments, the Schottky barriers of these compound semiconductors were 0.69 V at the highest. An n-type InAlP underlying semiconductor layer of a Schottky gate electrode presented a Schottky barrier height higher than 0.69 V by about 10%.

Figure 1:
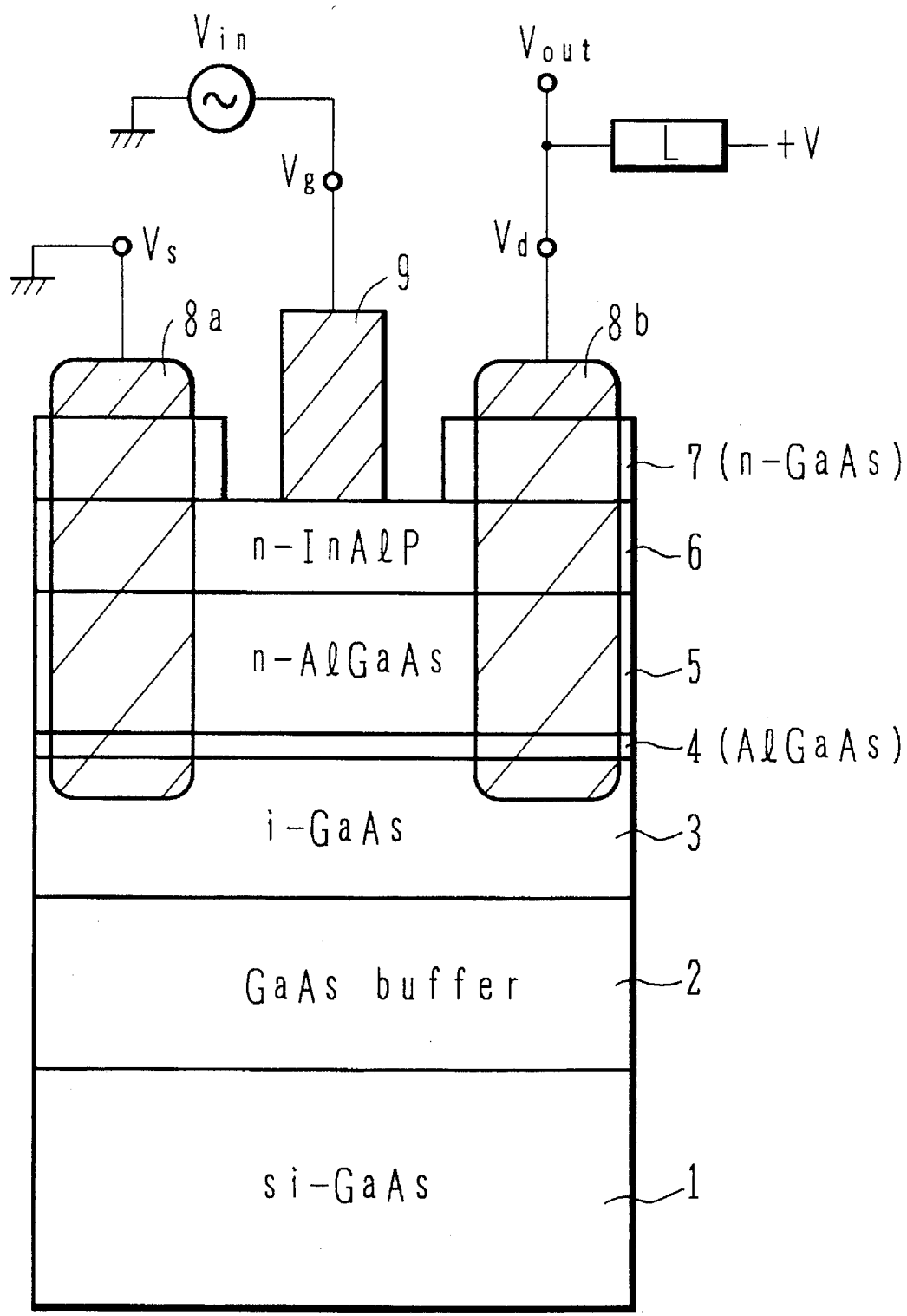
FIG. 1 is a schematic cross sectional view showing the structure of a HEMT according to an embodiment of the invention.

FIG. 1 is a schematic cross sectional view showing the structure off a HEMT according to an embodiment of the invention. On the surface of a semi-insulating GaAs substrate 1 doped with Cr, a non-doped GaAs buffer layer 2 is first grown to a thickness of about 0.5 μm by MOCVD. Sequentially grown thereafter on the buffer layer 2 by MOCVD are a non-doped GaAs active layer 3 of about 0.1 μm thick, a non-doped $Al_{0.3}Ga_{0.7}As$ spacer layer 4 of about 3 nm thick, and an n-type $Al_{0.3}Ga_{0.7}As$ electron supply layer 5 of about 100 nm thick doped with Si to about $1\times10^{18}$ cm$^{-3}$. These processes are generally the same as conventional HEMT manufacturing processes.

On the electron supply layer 5, an n-type $In_{0.5}Al_{0.5}P$ barrier layer 6 doped with Si to about $1\times10^{18}$ cm$^{-3}$ is grown to a thickness of about 3 nm. On this barrier layer 6 an n-type GaAs cap layer 7 doped with Si to about 1 to $3\times10^{18}$ cm$^{-3}$ is grown to a thickness about 10 to 50 nm.

Next, a resist pattern having a pair of openings is formed on the cap layer 7. A AuGe alloy layer and an Au layer are formed by evaporation to respective thicknesses of about 50 nm and 200 nm. The unnecessary metal layer on the resist pattern is removed together with the resist pattern by lift-off, and source/drain electrodes 8a and 8b are left only at the regions of the openings. Thereafter, the source/drain electrodes 8a and 8b are alloyed to establish ohmic contact with the active layer 3.

A transfer region of two dimensional gas is formed near the interface between the active layer 3 and the spacer layer 4. Thus, it is sufficient For the alloyed ohmic contacts, if they reach the two dimensional electron gas.

Next, by using a resist mask covering the source/drain electrodes and exposing a portion of the contact layer 7 between the ohmic electrodes, the exposed contact layer 7 is etched by mixed etchant of HF and $H_2O_2$. This wet etching automatically slops when the n-type InAlP barrier layer 6 is exposed.

On the n-type InAlP barrier layer 6 exposed between the source/drain electrodes 8a and 8b, an Al gate electrode 9 is formed to a thickness of about 0.2 μm by a lift-off method using a resist mask.

The gate electrode 9 is connected via a control signal terminal Vg to an input signal source Vin. The source electrode 8a is grounded via a source terminal, and the drain electrode 8b is connected via a drain terminal Vd to an output terminal Vout. The drain terminal Vd is connected via a load L to a power supply+V.

The Al gate electrode 9 forms a Schottky contact with the n-type InAlP barrier layer 6, with a high Schottky barrier height. Because the n-type InAlP barrier layer 6 has a thin thickness of about 3 nm, it does not substantially change the influence of the gate electrode 9 upon the active layer 3, nor does it much influence the ohmic nature between the source/drain electrodes 8a and 8b and the active layer 3.

The characteristics of the active layer with or without an InAlP layer before the formation of electrodes were measured. The density and mobility of two dimensional electron gas (2 DEG) in the active layer were measured at room temperature and at 77K.

TABLE 2

| | With InAlP | | Without InAlP | |
|---|---|---|---|---|
| | Room Temp. | 77K | Room Temp. | 77k |
| 2DEG Density | 2.0E12 | 9.7E11 | 1.8E12 | 1.0E12 |
| Mobility | 4200 | 33000 | 4500 | 33000 |

The 2 DEG density has a unit of $cm^{-2}$, and E12 represents $\times 10^{12}$. The unit of the mobility is $cm^2/(V \cdot sec)$.

As seen from the measurement results, the characteristics of the active layer are scarcely influenced by the formation of the InAlP layer on the electron supply layer.

Next, a change in the characteristics of the gate electrode with the InAlP layer was checked by the following experiments.

Figure 2A:
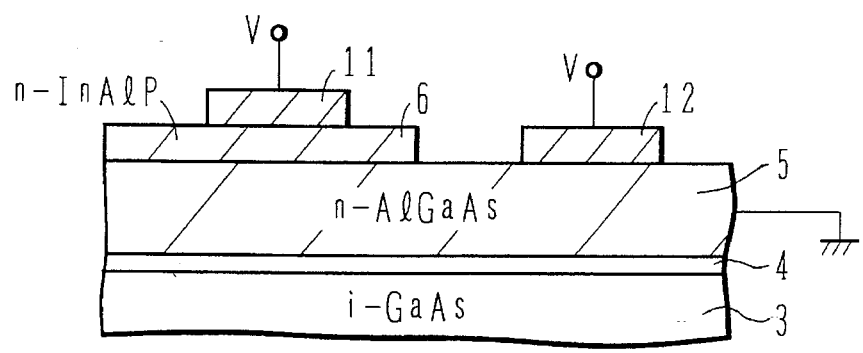
FIGS. 2A to 2C are a cross sectional view and graphs explaining the experiments which ascertain the characteristics of the embodiment HEMT shown in FIG. 1.

As shown in FIG. 2A, the n-type $In_{0.5}Al_{0.5}P$ layer 6 on the n-type $Al_{0.3}Ga_{0.7}As$ electron supply layer 5 was partially etched and removed. Al electrodes 11 and 12 having a diameter off about 100 μm were formed at the same time on the n-type InAlP layer 6 and on the n-type AlGaAs layer S by evaporation/lift-off. The I-V characteristics of these Schottky electrodes 11 and 12 are shown in FIGS. 2B and 2C.

Figure 2B:
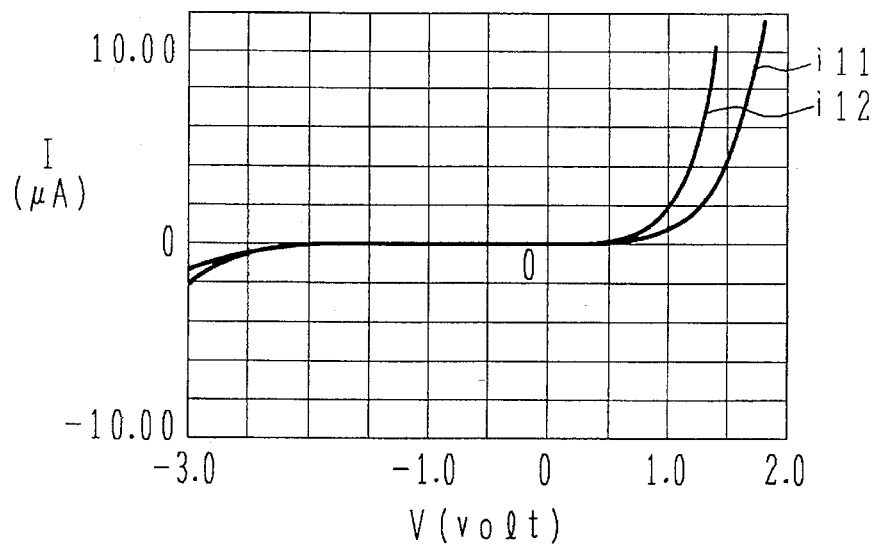
Figure 2C:
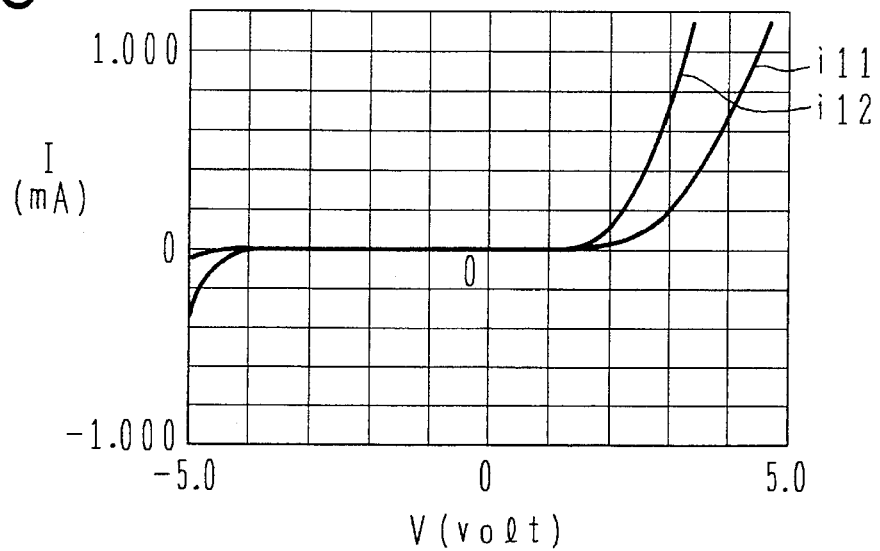

The abscissa of the graph shown in FIG. 2B represents an applied voltage V, and the ordinate represents a current in μA flowing through the Schottky electrodes. The abscissa of the graph shown in FIG. 2C represents an applied voltage V in a scale different from FIG. 2B, and the ordinate represents a current in mA flowing through the Schottky electrodes. The graph of FIG. 2C shows the broader I-V characteristics than the graph of FIG. 2B.

As seen from the graphs, the characteristic curve i11 off the Schottky electrode 11 of FIG. 2A rises at a higher voltage than the characteristic curve i12 of the conventional Schottky electrode 12. Voltages generating the same current are always higher at the Schottky electrode 11 than the Schottky electrode 12.

For example, as seen from FIG. 2B, the forward voltage generating a forward current of 2 μA (0.025 A/cm²) is about 1.2 V in the case of the Schottky electrode 11 on the InAlP layer 6, whereas it is about 1.0 V in the case of the Schottky electrode 12 on the AlGaAs layer 5.

Assuming that a leak current limit is 0.025 A/cm², a voltage up to 1.2 V can be applied to the Schottky electrode 11, whereas a voltage up to 1.0 V can be applied to the Schottky electrode 12.

Therefore, a forward voltage higher by about 0.2 V than a conventional value can be applied to the gate electrode 9 of HEMT shown in FIG. 1. As the leak current limit changes, the difference between applicable voltages changes. As seen FIG. 2C, the larger is the leak current limit, the higher becomes the applicable gate voltage difference.

In the embodiment shown in FIG. 1, n-type AlGaAs is used for the electron supply layer. Instead, n-type InGaP may be used. Also in this case, inserting the InAlP layer 6 between the electron supply layer and the gate electrode raises a forward voltage applicable to the gate electrode.

Although Al is used as the gate electrode, $WSi_x$ may be used. Also in this case, inserting the InAlP layer between the electron supply layer and the gate electrode will increase a Schottky barrier height similarly.

In the embodiment shown in FIG. 1, the InAlP barrier layer 6 lies also under the source/drain electrodes. However, the InAlP layer is not required to be laid under the region where the source/drain electrodes are formed.

Figure 3:
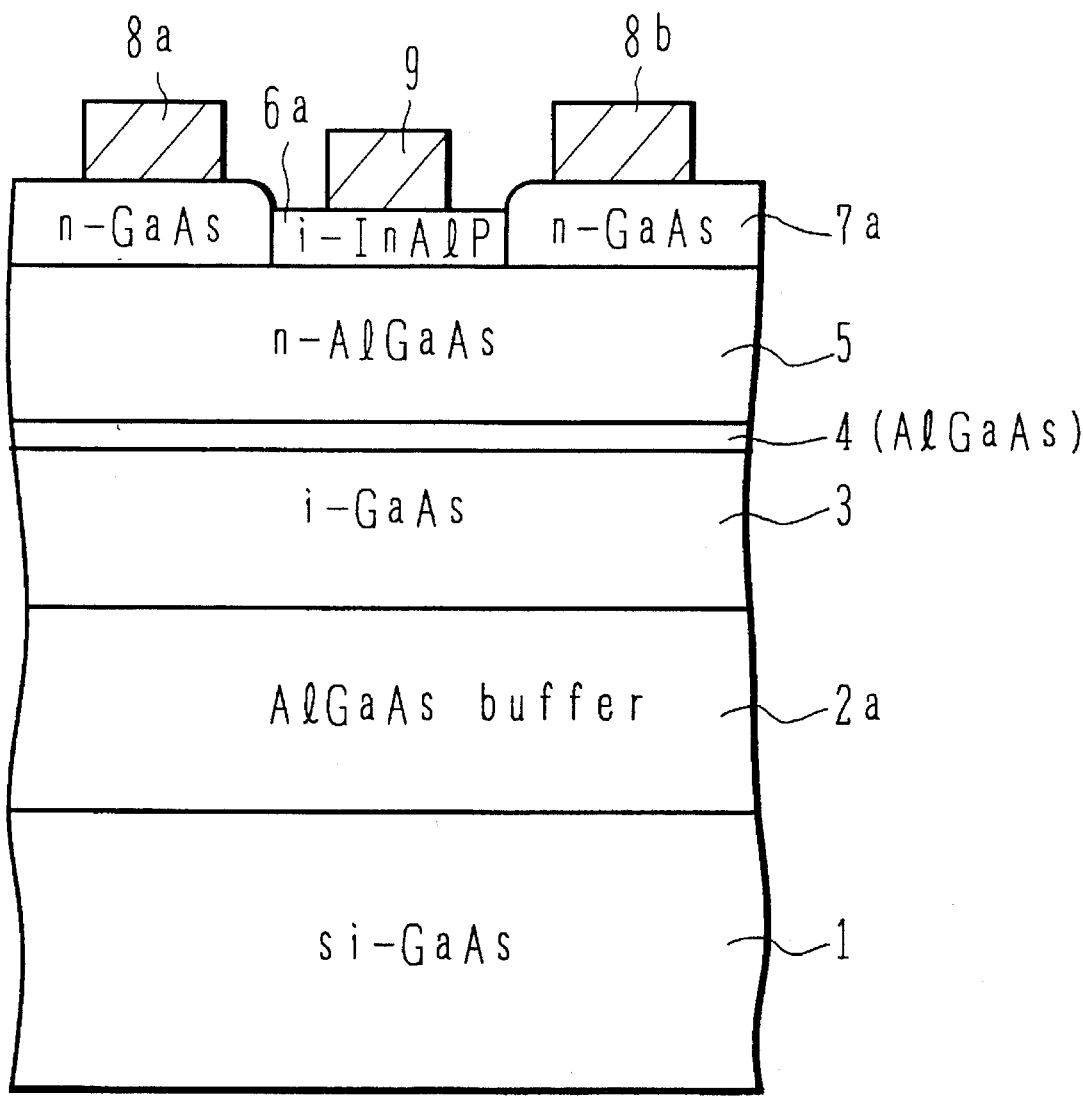
FIGS. 3 and 4 are schematic cross sectional views showing the structures of HEMT's according to other embodiments of the invention.

FIG. 3 shows a structure of a HEMT according to another embodiment of the invention. Epitaxially grown on a semi-insulating GaAs substrate 1 are an $Al_{0.3}Ga_{0.7}As$ buffer layer 2a, a non-doped GaAs active layer 3, a non-doped $Al_{0.3}Ga_{0.7}As$ spacer layer 4, and an n-type $Al_{0.3}Ga_{0.7}As$ electron supply layer 5. On the electron supply layer 5 a non-doped $In_{0.5}Al_{0.5}P$ layer 6a is epitaxially grown to a thickness of 3 to 10 nm at the region where a gate is formed, and an n-type GaAs contact layer 7a is epitaxially grown to a thickness of 10 to 50 nm on both sides the InAlP layer 6a.

On the non-doped InAlP layer 6a a gate electrode 9 for example of Al is formed, and on the n-type GaAs contact layer 7a source/drain electrodes 8a and 8b for example of AuGe/Au are formed.

In this embodiment, AlGaAs is used as the buffer layer 2a. AlGaAs has a larger band gap than GaAs, and is more effective for electrically isolating the active layer 3 from the substrate 1.

In this embodiment, the InAlP layer 6a is formed only under the gate electrode, and removed from the region under the source/drain electrodes. The n-type GaAs contact layer 7a is therefore formed directly on the n-type AlGaAs electron supply layer 5. A good ohmic contact can therefore be ensured. Since the InAlP barrier layer 6a is not required to take the ohmic electrode characteristics into consideration, it is not doped with impurities. A better Schottky electrode can therefore be ensured. The other structures and functions are the same as the embodiment shown in FIG. 1, and so the description thereof is omitted.

InAlP can establish a lattice matching with GaAs so that it is suitable for use in a compound semiconductor device to be formed on a GaAs substrate. However, a substrate having a slight lattice mismatch with InAlP may also be used by thinning the InAlP layer.

Figure 4:
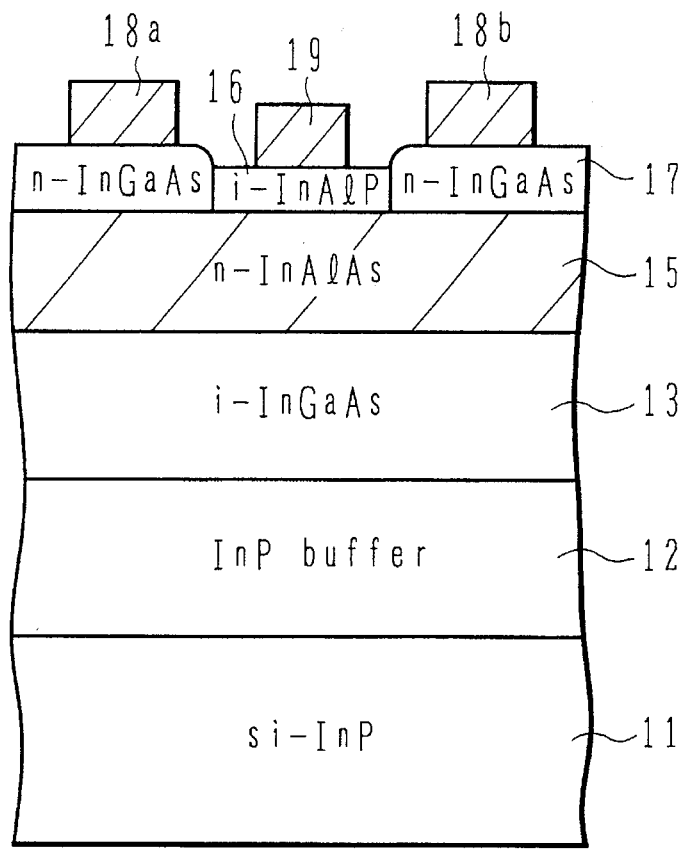

FIG. 4 shows a structure of a HEMT according to still another embodiment of the invention. Epitaxially grown on a semi-insulating InP substrate 11 are a non-doped InP buffer layer 12, a non-doped InGaAs active layer 13 (composition: In 0.53 Ga 0.47), and an n-type InAlAs electron supply layer 15 (composition: In 0.52, Al 0.48). These layers are preferably made to have a lattice match with the InP substrate 11.

On the n-type InAlAs electron supply layer 15 a non-doped InAlP barrier layer 16 (composition: In 0.9-0.5, Al 0.1-0.5) is epitaxially grown at the region where a gate electrode is to be formed, and removed from the region on both sides of the gate electrode. In the case of $In_{0.5}Al_{0.5}P$, the InAlP layer should have a thickness less than the critical thickness, e.g. 5–1 nm. On the exposed n-type InAlAs electron supply layer 15 an n-type InGaAs contact layer 17 (composition: In 0.53, Ga 0.47) is epitaxially selectively re-grown.

A Schottky gate electrode 19 for example of Al is formed on the non-doped InAlP barrier layer 16, and ohmic source/drain electrodes 18a and 18b for example of AuGe/Au are formed on the n-type InGaAs contact layer 17.

The InAlP barrier layer 16 cannot be epitaxially formed to have a lattice match with the InP substrate 11. However, if the thickness is selected below the critical thickness, the InAlP barrier layer can be epitaxially formed without containing excessive lattice defects. It is preferable to set the thickness of the InAlP layer 16 to 5 nm or less. The InGaAs active layer 13 provides a two dimensional electron gas mobility higher than a GaAs active layer, affording potential to manufacture a HEMT operable at a higher frequency.

The n-type InGaAs contact layer provides a better ohmic contact than an n-type GaAs contact layer, being able to manufacture a HEMT with a lower on-resistance.

In the above embodiments, an InAlP layer is used in a HEMT. Other semiconductor devices may use an InAlP layer as an underlying semiconductor layer of a Schottky electrode.

Figure 5:
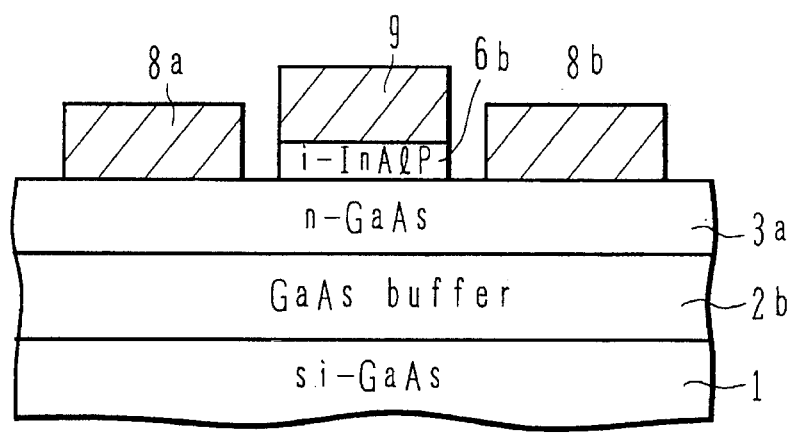
FIG. 5 is a schematic cross sectional view of a MESFET according to the further embodiment of the invention.
Figure 6:
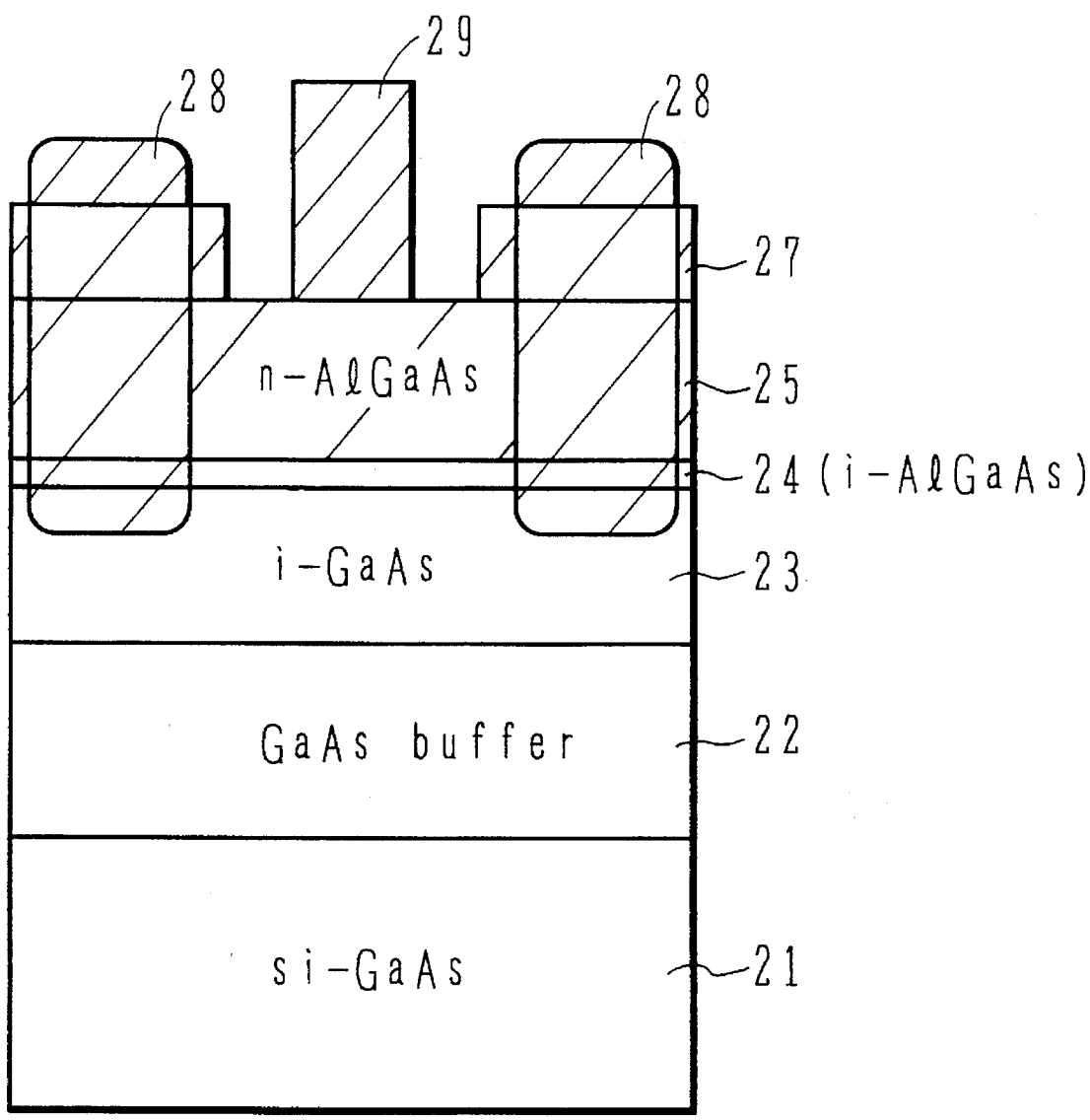
FIG. 6 is a schematic cross sectional view showing the structure of a HEMT according to a conventional technology.

FIG. 5 shows a structure of a MESFET according another embodiment of the invention. Epitaxially grown on a semi-insulating GaAs substrate 1 are a non-doped GaAs buffer layer 2b and an n-type GaAs active layer 3a. On the n-type GaAs active layer 3a a non-doped $In_{0.5}Al_{0.5}P$ barrier layer 6b, is epitaxially formed on a partial surface of the active layer 3a. A Schottky gate electrode 9 for example of Al is formed on the non-doped InAlP barrier layer 6b, and source/drain electrodes 8a and 8b for example of AuGe/Au are formed on the n-type GaAs active layer 3a to be in ohmic contact with the layer 3a.

The Schottky gate electrode 9 is formed on the non-doped InAlP barrier layer 6b over the n-type GaAs active layer 3a, being able to have a higher Schottky barrier.

The present invention has been described in connection with the preferred embodiments. The invention is not limited only to the above embodiments. For example, instead of crystal growth by MOCVD, other epitaxial growth methods such as molecular beam epitaxy (MBE) may be used.

Figure 8:
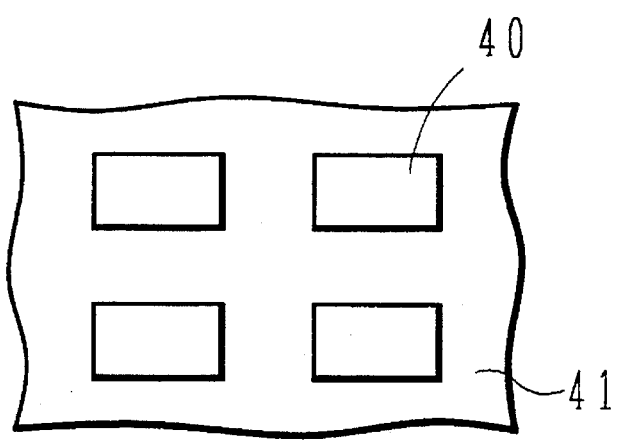
FIG. 8 is a schematic plan view of an integrated semiconductor device according to another embodiment of the invention.

The material of an ohmic electrode and a Schottky electrode may be selected from a variety of materials depending upon the underlying semiconductor layer. Although a single transistor element is shown in each drawing, it may be used as a constituent element of an integrated circuit. As shown in FIG. 8, in the case of an integrated circuit structure, isolation regions 41 between elements 40 may be formed by implanting oxygen ions into the isolation regions. It is apparent to those skilled in the art that various modifications, improvements, combinations and the like can be made without departing from the scope of the appended claims.

I claim:

1. A field effect compound semiconductor device comprising:
    a GaAs semiconductor substrate;
    a plurality of group III-V compound semiconductor crystal layers formed on said GaAs semiconductor substrate and including an active layer for transferring carriers;
    an InAlP layer substantially lattice-matched with GaAs formed at least on a partial surface of said group III-V compound semiconductor crystal layers;
    a gate electrode formed on said InAlP layer, forming Schottky contact; and
    a pair of source/drain electrodes disposed to interpose therebetween said gate electrode, and forming ohmic contact with said active layer.

2. A field effect compound semiconductor device according to claim 1, wherein said active layer is made of n-type GaAs or n-type InGaAs.

3. A field effect compound semiconductor device according to claim 2, wherein said group III-V compound semiconductor crystal layers further include an AlGaAs layer or an InGaP layer formed on said active layer.

4. A field effect compound semiconductor device according to claim 3, wherein said InAlP layer is formed only on a partial surface of said group III-V compound semiconductor crystal layers, the device further comprising an n-type GaAs layer or an n-type InGaAs layer formed on the surface of said group III-V compound semiconductor crystal layers and interposing therebetween said InAlP layer.

5. A field effect compound semiconductor device comprising:
    a GaAs semiconductor substrate;
    a group III-V compound semiconductor crystal layer formed on said GaAs semiconductor substrate for transferring carriers in the surface region of said layer;
    an InAlP crystal layer substantially lattice-matched with GaAs, and formed at least on a partial surface of said group III-V compound semiconductor crystal layer;
    a gate electrode formed on said InAlP crystal layer, forming a Schottky contact; and
    a pair of source/drain electrodes interposing therebetween said gate electrode, and forming the ohmic contact with said group III-V compound semiconductor crystal layer.

6. A field effect compound semiconductor device according to claim 5, wherein said group III-V compound semiconductor crystal layer is made of GaAs or InGaAs.

7. A field effect compound semiconductor device comprising:
    an InP substrate;
    an InGaAs channel layer formed on said InP substrate, said InGaAs channel layer providing substantially a lattice match with InP;
    an InAlAs layer formed directly on said InGaAs channel layer;
    an InAlP layer formed at least on a partial surface of said InAlAs layer;
    a gate electrode formed on said InAlP layer and forming Schottky contact; and
    a pair of source/drain electrodes interposing therebetween said gate electrode, and forming ohmic contact with said InGaAs channel layer.

8. A field effect compound semiconductor device according to claim 7, wherein said InAlP layer has a thickness of 5 nm or less.

9. A field effect compound semiconductor device comprising:
    a semiconductor substrate;
    a plurality of group III-V compound semiconductor crystal layers formed on said semiconductor substrate and including an active layer for transferring carriers;
    an InAlP layer formed only on a partial surface of said group III-V compound semiconductor crystal layers;
    a gate electrode formed on said InAlP layer, forming Schottky contact; and
    a pair of source/drain electrodes disposed to interpose therebetween said gate electrode, and forming ohmic contact with said active layer;
    wherein said group III-V compound semiconductor crystal layers further include an AlGaAs layer or an InGaP layer formed on said active layer; and
    wherein said field effect compound semiconductor device further comprises an n-type GaAs layer or an n-type InGaAs layer formed on the surface of said group III-V compound semiconductor crystal layers and interposing therebetween said InAlP layer.

10. A field effect compound semiconductor device comprising:
    a semiconductor substrate;
    a plurality of group III-V compound semiconductor crystal layers formed on and lattice-matched with said semiconductor substrate and including an active layer for transferring carriers;

an InAlP layer substantially lattice-matched with said substrate, and formed at least on a partial surface of said group III-V compound semiconductor crystal layers;

a gate electrode formed on said InAlP layer, forming Schottky contact; and a pair of source/drain electrodes disposed to interpose therebetween said gate electrode, and forming ohmic contact with said active layer.

11. A field effect compound semiconductor device according to claim 10, wherein semiconductor substrate is made of GaAs, and said active layer is made of n-type GaAs or n-type InGaAs.

12. A field effect compound semiconductor device according to claim 11, wherein said group III-V compound semiconductor crystal layers further include an AlGaAs layer or an InGaP layer formed on said active layer.

13. A field effect compound semiconductor device according to claim 12, wherein said InAlP layer is formed only on a partial surface of said group III-V compound semiconductor crystal layers, the device further comprising an n-type GaAs layer or an n-type InGaAs layer formed on the surface of said group III-V compound semiconductor crystal layers and interposing therebetween said InAlP layer.

14. A field effect compound semiconductor device comprising:

a semiconductor substrate;

a group III-V compound semiconductor crystal layer formed on and lattice-matched with said semiconductor substrate for transferring carriers in the surface region of said layer;

an InAlP crystal layer substantially lattice-matched with said semiconductor substrate, and formed at least on a partial surface of said group III-V compound semiconductor crystal layer;

a gate electrode formed on said InAlP crystal layer, forming a Schottky contact; and a pair of source/drain electrodes interposing therebetween said gate electrode, and forming the ohmic contact with said group III-V compound semiconductor crystal layer.

15. A field effect compound semiconductor device according to claim 14, wherein said group III-V compound semiconductor crystal layer is made of GaAs or InGaAs.

16. A field effect compound semiconductor device comprising:

a semiconductor substrate;

a plurality of group III-V compound semiconductor crystal layers formed on said semiconductor substrate and including an active layer for transferring carriers;

an InAlP layer formed at least on a partial surface of said group III-V compound semiconductor crystal layers;

a gate electrode formed on said InAlP layer, forming Schottky contact; and a pair of source/drain electrodes disposed to interpose therebetween said gate electrode, and forming ohmic contact with said active layer;

wherein said InAlP layer is formed only on a partial surface of said group III-V compound semiconductor crystal layers, the device further comprising an n-type GaAs layer or an n-type InGaAs layer formed on the surface of said group III-V compound semiconductor crystal layers and interposing therebetween said InAlP layer.

17. A field effect compound semiconductor device according to claim 16, wherein said semiconductor substrate is made of GaAs, and said active layer is made of n-type GaAs or n-type InGaAs.

18. A field effect compound semiconductor device according to claim 17, wherein said group III-V compound semiconductor crystal layers further include an AlGaAs layer or an InGaP layer formed on said active layer.

* * * * *